United States Patent [19]
Den Boef

[11] Patent Number: 4,890,061
[45] Date of Patent: Dec. 26, 1989

[54] MAGNETIC RESONANCE IMAGING APPARATUS

[75] Inventor: Johannes H. Den Boef, Eindhoven, Netherlands

[73] Assignee: U.S. Philips Corporation, New York, N.Y.

[21] Appl. No.: 241,633

[22] Filed: Sep. 8, 1988

[30] Foreign Application Priority Data

Sep. 18, 1987 [EP] European Pat. Off. ........ 87201783.5

[51] Int. Cl.$^4$ ............................................. G01R 33/20
[52] U.S. Cl. ..................................... 324/320; 324/319
[58] Field of Search ............... 324/300, 307, 309, 313, 324/318, 319, 320, 322; 355/216

[56] References Cited

U.S. PATENT DOCUMENTS

| | | | |
|---|---|---|---|
| 3,566,255 | 2/1971 | Jaynes | 324/318 |
| 4,698,591 | 10/1987 | Glover | 324/318 |
| 4,740,753 | 4/1988 | Glover | 324/318 |
| 4,761,614 | 8/1988 | Prammer | 324/307 |

*Primary Examiner*—Michael J. Tokar
*Attorney, Agent, or Firm*—Thomas A. Briody; Jack E. Haken; Jack D. Slobod

[57] ABSTRACT

A magnetic resonance apparatus is provided with a detection system comprising a coil, which may be part of a shim coil system. Signals detected by this system are used for a dynamic control of a shim coil system in order to mitigate dynamically adverse influences of eddy currents on the magnetic field homogenity in at least a region of interest within the coil system of the apparatus.

5 Claims, 2 Drawing Sheets

MAGNETIC RESONANCE IMAGING APPARATUS

BACKGROUND OF THE INVENTION

The invention relates to a magnetic resonance imaging apparatus, comprising an arrangement for generating a homogeneous steady magnetic field, a coil system for generating additional gradient magnetic fields which extend in the direction of the steady magnetic field and which vary linearly in three mutually perpendicular directions, an RF coil for generating an RF magnetic field perpendicularly to the direction of the steady field, a shim coil system and means to mitigate eddy current disturbances on the gradient fields to be generated.

DESCRIPTION OF THE PRIOR ART

Such an MR tomography apparatus is known, from EP 156442. An apparatus described there comprises an arrangement for generating a strong, homogeneous steady magnetic field which extends in the z-direction of an xyz system of coordinates. Such a coil arrangement normally consists of four or six concentric, annular coils whose central axis extends in the z-direction. Inside these coils the magnetic field is homogeneous in a comparatively large area, often indicated as examination area and has a flux density of between 0.1 T and 2 T. Flux densities over about 0.5 T are obtained by means of a superconducting coil system. A patient to be examined is introduced into the examination area on a support which is movable in the z-direction.

The MR tomography apparatus also comprises coil systems for generating magnetic fields which extend in the z-direction and which vary linearly in space in the x-, the y- and the z-direction. These coil systems are generally referred to as gradient coils. The coil system for generating a magnetic field which extends, and linearly varies in the z-direction, normally consists of at least two similar Gz coils which are arranged so as to be staggered with respect to one another in the z-direction and are symmetrically located with respect to the coils for the steady magnetic field. Between said Gz coils there is generated a gradient magnetic field which extends in the z-direction and which linearly varies as a function of the location in this direction when a current flows through these coils in opposite directions.

The coil system for generating a magnetic gradient field Gx which also extends in the z-direction, but which linearly varies in space in the x-direction comprises coils which are normally saddle shaped and are arranged on the circumference of a circular cylinder coaxial with the z-axis of the steady magnetic field.

The coil system for generating a magnetic gradient field Gy which extends in the z-direction and which linearly varies in the y-direction as a function of the location has a construction which is identical to that of the coil system for the gradient field Gx, except that it has been rotated azimuthally through 90° with respect thereto.

An RF coil generates a locally homogeneous RF magnetic field in the examination area, the frequency of this field corresponding to the Larmor frequency of the precissional motion of the nuclear spins about the z-axis in the examination area.

In a customary method performed by means of such an MR tomography apparatus the nuclear spins are excited in a slice of the object to be examined. To this end, the Gz gradient coils are energized by a current during the excitation of the nuclear spins by the RF coil, so that the magnetic field generated by the steady field coils then in fact varies linearly over the examination area. Consequently, the nuclear spins are excited in the slice whose Larmor frequency which is proportional to the magnetic field strength, lies within the frequency band of the RF exitation pulse. Subsequently, the Gx and/or Gy coils are energized so that the magnetic field inside the slice changes in the x-direction and/or the y-direction, respectively. As a result, nuclear spin distribution in an excited slice can be detected with the aid of an rf coil and an image of the slice can be reconstructed.

The reconstruction quality is influenced by the fact that the gradient fields do not exhibit exactly the predetermined variation in space, for example they do not vary exactly linearly as a function of the location. Moreover, this deviation from the predetermined variation is time-dependent. This phenomenon is caused by the eddy currents which occur when the currents through the gradient coils are switched and which produce magnetic fields which may deviate from the field of the coils in regard to their spatial and time dependency.

In order to mitigate these effects the prior art apparatus is provided with at least one further coil system for generating a magnetic field which also extends in the direction of the steady field and which varies non-linearly in space, the variation in time of the currents through the coil system being proportioned so that the defined variation in time and space of the magnetic flux density is obtained by superposition of the magnetic fields of all coil systems. With a single further coil system the deviations from the desired variation in time and space can usually only partly be eliminated. These deviations depend on the one hand on the actual construction of the MR apparatus and on the other hand also on the extent and the cause of the deviations from the desired variation. For example, the deviations caused by the occurrence of eddy currents are determined themselves by the variation in time of the energizing of the gradient coils; the Eddy currents are more pronounced as the energizing function of the gradient coils contains higher frequency components. The number of additional shim coils depends on the local variation of the eddy current field produced and even up to five or seven additional coil systems may be needed in order to realise a sufficient compensation. Even then the deviations in the gradient fields cannot exactly be compensated.

The elaboration to more coils is based on the considerations that any arbitrary magnetic field, inter alia also the magnetic field generated by the gradient coils and the magnetic field produced by the associated eddy currents, can be represented as a weighted sum of spherical functions of the zeroth, first, second, third etc. order, the number of orders in principle being infinite. However, the magnetic field components which vary according to higher-order spherical functions are generally negligible. Because the magnetic field of the gradient coils varies in time, the weighting factors of the individual spherical functions participating in said weighted sum also vary in time. With additional coil systems, corresponding to higher-order spherical functions and the gradient coils (Gx, Gy, Gz) each of which corresponds to a first-order spherical function, together with the coil system (1) for the steady magnetic field a magnetic field can be generated which exhibits an arbitrary variation in space. This only holds when components corresponding to the third or higher harmonics of the spherical functions are ignored and when the contribution by the individual coils is suitably weighted.

By this method the desired variation in space and time of the magnetic field thus cannot be exactly obtained and relatively expensive additional coils are necessary.

SUMMARY OF THE INVENTION

It is the object of the present invention to more accurately reduce the disturbing effects of the eddy currents occuring when the gradient coils are switched and similar effects due to other inaccuracies in the variation in space of the magnetic fields.

To this end a magnetic resonance imaging apparatus of the kind set forth in accordance with the invention is characterized in that a detection system is provided to detect dynamic inhomogenieties in a magnetic field generated in the examination area time dependently and to control shim coil activating currents in dependence of signals thus obtained.

All time dependent inhomogeneities are detected and relevant shim coils are on-line activated accordingly, thus all disturbances can now be compensated for exactly.

In a preferred embodiment shim coils are used as well for detection as for compensating avoiding the need to add expensive further coil systems to the apparatus.

In a further embodiment detection coils are localized in the apparatus in such a manner that for a given region of interest the compensation is very accurate thus avoiding the introduction of more homogenization than needed for the imaging.

BRIEF DESCRIPTION OF THE DRAWING

Some preferred embodiments in accordance with the invention will be described, hereinafter with reference to the drawing. Therein.

DETAILED DESCRIPTION OF THE PREFERRED EMBODIMENTS

Figure 1:
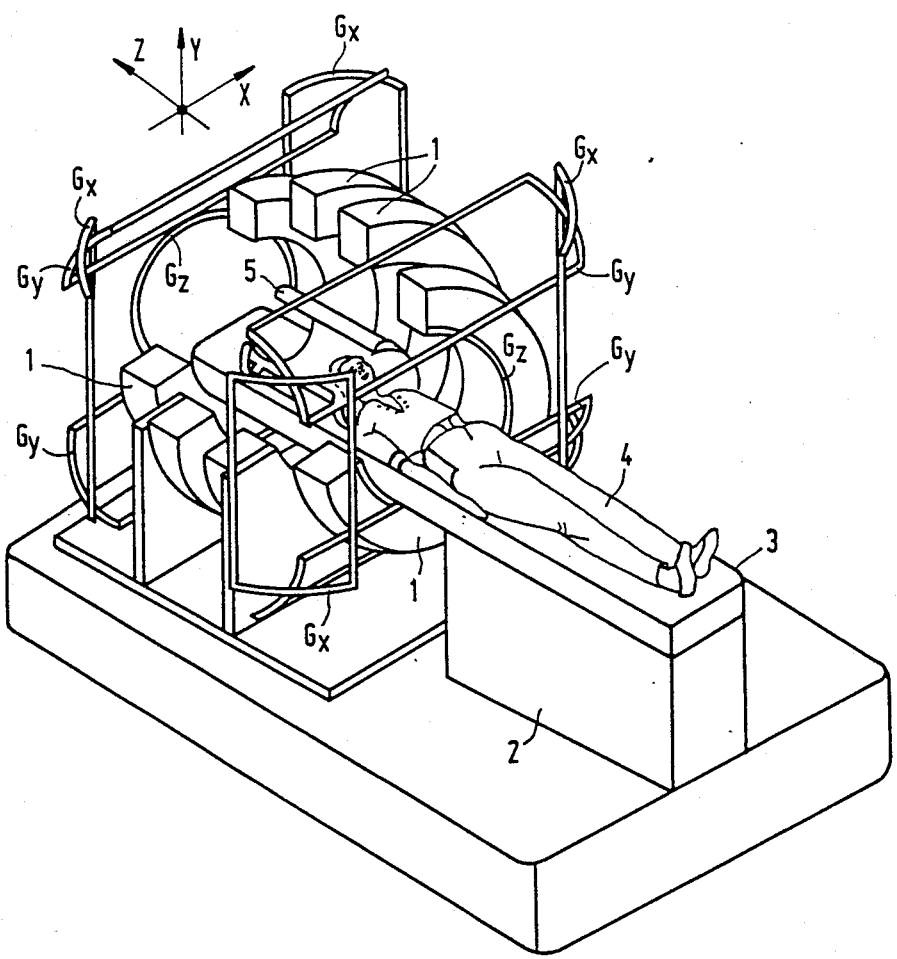
FIG. 1 shows a magnetic imaging apparatus in accordance with the invention.

A magnetic resonance apparatus given in FIG. 1 shows a number of concentric annular coils 1 whose common central axis extends in a z-direction. With these coils a homogeneous steady magnetic field can be generated in an examination zone within the coils, extending in the z-direction. A patient table comprises a base 2 and a table top 3 which is slidably mounted upon the base in order to register a patient 4 in the examination zone. The magnet system here further comprises four x-gradient coils Gx, four y-gradient coils Gy, two ring shaped z-gradient coils Gz and an RF coil 5 suitable for exitation, and, as well, for detecting resonance signals.

Figure 2:
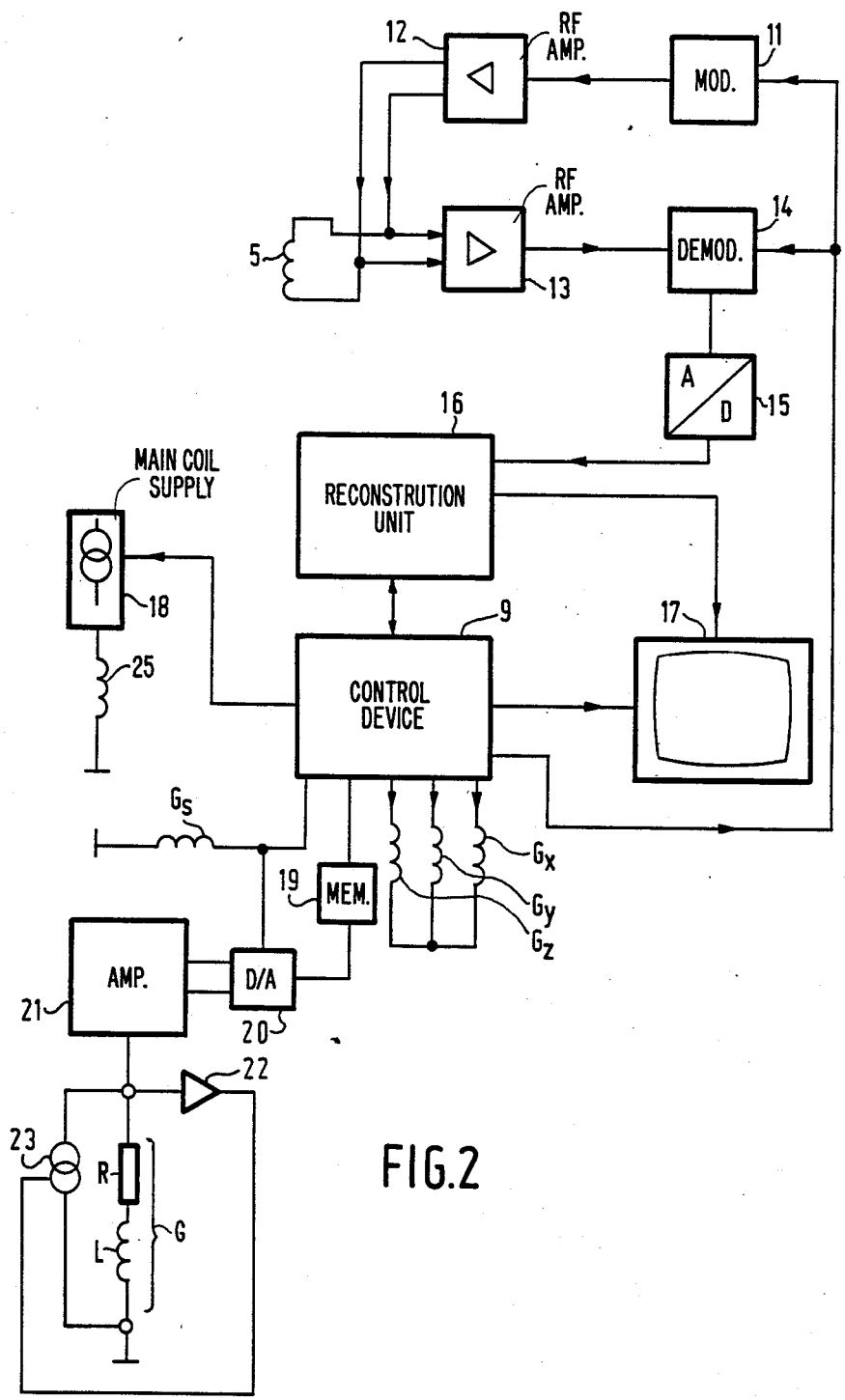
FIG. 2 shows an embodiment of a detection system for such an apparatus in a block-diagram.

The apparatus shown in FIG. 2 comprises a control device 9 which controls inter alia a modulator 11. The modulator 11 produces a carrier oscillation which is applied to the RF coil 5 via a power amplifier 12, the frequency of the modulated oscillation as well as the intensity of the magnetic field generated by the coils being coordinated to one another so that nuclear spin resonance is excited in a slice of the body examined. The signals induced in the coil 5 after this excitation are applied to a phase-sensitive demodulator 14 via an amplifier 13, the output signal of said demodulator being converted into a digital data word by an analog-to-digital converter 15 in order to be applied to a reconstruction unit 16. On the basis of the data received, this unit determines the spatial distribution of the nuclear spins in the excited slice by means of a predetermined algorithm, said distribution being displayed, for example by means of a monitor 17.

The control unit 9 also controls the current supply 18 for a main coil system 25 and the current through the gradient coils Gx, Gy and Gz which generate magnetic fields which extend in the z-direction and which vary linearly in the x, the y and the z-direction, respectively. An extensive general description of inhomogenities arising in the gradient fields is given in U.S. Pat. No. 3,566,255, EP 156442 and in "The Review of Scientific Instruments", Vol. 32, No. 3, pages 241 to 250.

The control 9 unit further controls the gradient coils Gx, Gy and Gz and is here connected to a detection coil G via a memory 19, a digital-to-analog converter 20 and an amplifier 21.

With the aid of the coil G the variation in time of terms to be compensated for in the dynamic behaviour of the gradient fields can be detected and can be used to compensate for variations in time occurring in the coil system. The signals thus obtained can be adapted in the system 20–21 to control a shim coil system Gs on-line. The detection coil G can also be part of the shim coil system, but can also be an auxiliary coil. Such a coil can be adapted to a special region of interest within the examination zone in order to improve locally the homogeniety of the gradient fields. The potential over the coil G is measured. This potential, being equal to $L \, d\phi/dt$, should be zero in order to keep $d\phi/dt$ zero and no variation in time in the magnetic flux occurs. By doing so, no extra time dependent magnetic field can occur.

Coil G, for example a part of the shim coil is fed from a current source 23 and when the coil the inductive reactance is also used as detection coil $\omega L$ (where L is the reductance of the coil) must be high with respect to R (where R is the resistance of the coil); and the potential of the current source 23 should not be influenced by the current of source 23 due to the amplifier 22. This means that the circuitry should be so arranged that the potential of the current source 23 remains constant even when the current delivered from source 23 changes.

For reading detection signals from the detection coil G this coil connected to the amplifier 21. There is also an extra amplifier 22 to which the coil G is connectable via a switching mechanism 23 which enables selective connection to the coil G or short circuiting the amplifier 22 enabling feeding of the coil G with compensating currents if used as a shim coil itself as well.

What is claimed is:

1. Magnetic resonance imaging apparatus comprising means for generating a homogeneous steady magnetic field in an examination area, a gradient coil system for generating dynamic gradient magnetic fields which extend i the direction of the steady magnetic field and which vary linearly spatially in three mutually perpendicular directions, an RF coil for generating an RF magnetic field perpendicular to the direction of the steady magnetic field, a shim coil system for providing a correcting magnetic field in the examination area in response to activating currents, a detecting coil for detecting signals indicative of dynamic inhomogenieties in the magnetic fields generated in the examination area and means for dynamically controlling the shim coil activating currents in dependence of the signals thus detected, whereby dynamic disturbances of the magnetic fields in the examination area due to gradient magnetic field induced eddy currents are mitigated.

2. Magnetic resonance imaging apparatus as claimed in claim 1, characterized in that the detecting coil forms part of the shim coil system.

3. Magnetic resonance imaging apparatus as claimed in claim 1 or 2, characterized in that the detecting coil is adapted to a region of interest within the examination area.

4. Magnetic resonance imaging apparatus as claimed in claim 1 or 2, characterized in that the detection coil is a part of said shim coil system and further comprising circuitry for independent reading detection signals from the detection coil and delivering activating currents to the detection coil.

5. Magnetic resonance imaging apparatus as claimed in claim 1 or 2 characterized in that the resistance of the detection coil is kept relatively low with respect to the inductive reactance of the detection coil.

* * * * *